(12) United States Patent
Canonico

(10) Patent No.: US 6,218,615 B1
(45) Date of Patent: Apr. 17, 2001

(54) COMMUNICATION EQUIPMENT RACK

(76) Inventor: Rocco Canonico, 5-01 Lyncrest Ave., Fair Lawn, NJ (US) 07410

( * ) Notice: Subject to any disclaimer, the term of this patent is extended or adjusted under 35 U.S.C. 154(b) by 0 days.

(21) Appl. No.: 09/290,318

(22) Filed: Apr. 12, 1999

(51) Int. Cl.$^7$ .................................................. H05K 5/00
(52) U.S. Cl. ................... 174/50; 174/57; 174/58; 220/3.2; 220/3.7
(58) Field of Search ................. 174/50, 57, 58, 174/DIG. 9, 51; 220/3.2, 3.7

(56) References Cited

U.S. PATENT DOCUMENTS

| | | | |
|---|---|---|---|
| 3,622,029 | * 11/1971 | Ware | 220/3.7 |
| 4,634,015 | * 1/1987 | Taylor | 220/3.7 |
| 4,712,157 | * 12/1987 | Simonson et al. | 174/58 X |
| 5,272,279 | * 12/1993 | Filshie | 174/50 |
| 5,596,174 | * 1/1997 | Sapienza | 174/57 |
| 5,901,033 | * 5/1999 | Crawford et al. | 174/51 |

* cited by examiner

*Primary Examiner*—Dean A. Reichard
*Assistant Examiner*—Angel R. Estrada
(74) *Attorney, Agent, or Firm*—Weingram & Associates, P.C.

(57) ABSTRACT

An enclosure is provided which includes a housing having deployable panels to accommodate hub hardware of different dimensions. The enclosure is hingedly connected to a mounting structure or a wall and constructed with symmetrical features so that the housing can be inverted for hinged opening in either direction to access the hub hardware enclosed therein.

18 Claims, 6 Drawing Sheets

COMMUNICATION EQUIPMENT RACK

BACKGROUND OF THE INVENTION

1. Field of the Invention

The present invention relates to electronic equipment enclosures, particularly those enclosures that support computer hardware and wiring for access thereto.

2. Description of the Related Art

Computer equipment and networks require hubs to permit multiple computers on the network to communicate. The computers on a network are connected to the hub which in turn interconnects the computers to the file server for the network. In the computer industry, enclosures for hardware are available and are described in the following patents.

| U.S. Pat. No. | Inventor(s) |
| --- | --- |
| 3,784,728 | DeBortoli |
| 3,904,936 | Hamrick, Jr. |
| 4,605,275 | Pavel |
| 4,609,235 | Ventura |
| 5,011,033 | Roth |
| 5,208,737 | Miller |
| 5,272,279 | Filshie |
| 5,595,316 | Gallarelli et al |
| 5,721,394 | Mulks |

Publication

AT&T LGX® Fiber Distribution System

U.S. Pat. No. 3,784,728 to DeBortoli discloses a connecting block with hinged terminal member consisting of a pair of support members mounted to a frame for pivoting movement to provide access to the rear or back ends of the terminal clips. Access to the interior is provided at the top and through an aperture for the wiring.

U.S. Pat. No. 3,904,936 to Hamrick, Jr. discloses a rotating terminal block assembly consisting of a housing having jumper wire exit windows at a rear and bottom thereof, and a rotatable terminal block panel.

U.S. Pat. No. 4,605,275 to Pavel discloses a modular and encapsulated cross-connect terminal unit consisting of a plurality of modular blocks having fields which coact with corresponding fields of a housing mounted to a suitable base.

U.S. Pat. No. 4,609,235 to Ventura discloses a drawer for electrical cabinets consisting of a frame and a front wall adapted to be coupled to the frame, with the front wall having at least one panel and a coupling member for removably coupling the panel to the frame. The coupling member includes resilient elements and stop members adapted to be mutually coupled through a "snap action" by applying a front thrust to the panel.

U.S. Pat. No. 5,011,033 to Roth discloses an electrical service center consisting of a three-piece electrical box in which a top and bottom for the box can be snapped into place. The top and bottom are adapted to be mounted in slidable contact with the body and are provided with wire access openings.

U.S. Pat. No. 5,208,737 to Miller discloses a cross connector cabinet for telecommunications equipment consisting of a cabinet, in which columns of cross-connecting blocks are disposed in back-to-back relationship, and a connection chamber for connecting the wires of such block to the wires of an incoming or outgoing cable positioned above the cross-connect cables. The cabinet is adapted to be sealed and filled with an encapsulant.

U.S. Pat. No. 5,272,279 to Filshie discloses a general purpose electrical box kit consisting of a metal housing having an opening suitable to be closed either by a pivotable lid or by a flat lid directly screwed thereon. The lid can be changed without having to change the whole box and there is provided in the sidewalls of the housing breakable discs through which wiring can be inserted to the interior of the box.

U.S. Pat. No. 5,595,316 to Gallarelli et al discloses an equipment enclosure for high-end hub-type products and consisting of identical top and bottom covers, and front panel/rack/tube assembly and side plates. This reference discloses a need in the art for equipment enclosures adaptable for rack, wiring closet, and free-standing mounting.

U.S. Pat. No. 5,721,394 to Mulks discloses a flush mount multiport connection box adapted, in particular, for being mounted entirely within a standard depth wall or column framing consisting of a box having three closed sides and an open bottom, and a conduit connector disposed at a top thereof. A removable connector module mounted in the box supports a fitting to which the cables are attached.

The AT&T Publication discloses an LGX® Fiber Distribution System consisting of communication hardware shelves. The Front Access Termination Shelf (pages 2–5) discloses the "ability of the connector bulkhead to slide forward and drop 90-degrees bringing the rear connectors into an accessible position from the front." The Splice Organizer mounted in a shelf (pages 2–25) appears to disclose an organizer tray which is deployable/retractable with respect to the shelf.

The devices above, however, do not provide for hinged and symmetrical construction whereby computer hardware such as hub products, can be mounted therein and the device inverted for mounting to be hingedly opened in either direction for access to the hub at an interior of the enclosure.

The enclosures disclosed above also lack the adaptability to accommodate the older hub hardware constructed to the standard depth of 8"–9", and the newly constructed hubs which operate at faster speeds and have a depth approaching the new industry standard of 14½".

Accordingly, known devices lack the adaptability for access to an interior of the enclosure, as well as to accommodate different hub hardware constructions for increased speed and features. In other words, old enclosures and rack systems will not accommodate the new hubs and therefore, in most cases, the existing hub enclosures have to be removed and new enclosures mounted or stacked to accommodate the new hub hardware. This is expensive and time consuming, and for environments in which a rip-out must occur of the stud mounted enclosures, it is extremely disruptive to system operation and increases the chance for system failure. Known enclosures for hub products are not constructed to be adapted to receive the new components without substantial reconstruction of the mounting of the enclosure to the wall in those instances where such mounting is employed.

OBJECTS AND SUMMARY OF THE INVENTION

It is an object of the present invention to provide a computer equipment rack or enclosure, such as for computer hub equipment, which is constructed and adapted to accommodate hub hardware having varying dimensions.

It is another object of the present invention to provide an enclosure having a hinged rear wall for mounting of the enclosure and to permit the enclosure to be swung open for access to the hub hardware therein.

It is another object of the present invention to provide an enclosure which is of symmetrical construction, whereby the enclosure can be inverted and mounted for hingedly opening in an opposite direction.

It is another object of the present invention to provide an enclosure having slidably movable arms to accommodate hardware of different sizes and shapes.

It is another object of the present invention to provide a hub enclosure having mounting holes to receive patch panels at a front thereof for connection to the enclosed hub hardware.

It is another object of the present invention to provide a hub enclosure having access ports for wiring arranged at a plurality of sides of the enclosure.

It is another object of the present invention to provide a hub enclosure constructed and arranged for stackable mounting, thereby maintaining wiring between a plurality of the enclosures hidden from view.

It is another object of the present invention wherein construction of the enclosures is such that with stackable mounting of a plurality of the enclosures, one enclosure can be worked on without disrupting the service of the remaining enclosures.

It is another object of the present invention to provide a hub enclosure which is constructed and arranged for wall mounting, stacking, or free-standing use.

The present invention provides an enclosure for hub hardware and consists of: a housing having a support area therein and construction symmetrical at opposed sides of a plane extending through a longitudinal axis of the housing, the housing adapted to provide access to the support area when disposed in either one of a first position or a second position inverted from that of the first position about the plane; and deployable panels operatively associated with the housing, the panels movable with respect to the housing to adjust the space in the housing when oriented in either one of the first position or the second position.

BRIEF DESCRIPTION OF THE DRAWINGS

For a more complete understanding of the present invention, reference may be had to the following description of exemplary embodiments of the present invention considered in connection with the accompanying drawings, in which.

DETAILED DESCRIPTION OF THE PREFERRED EMBODIMENTS

Figure 1:
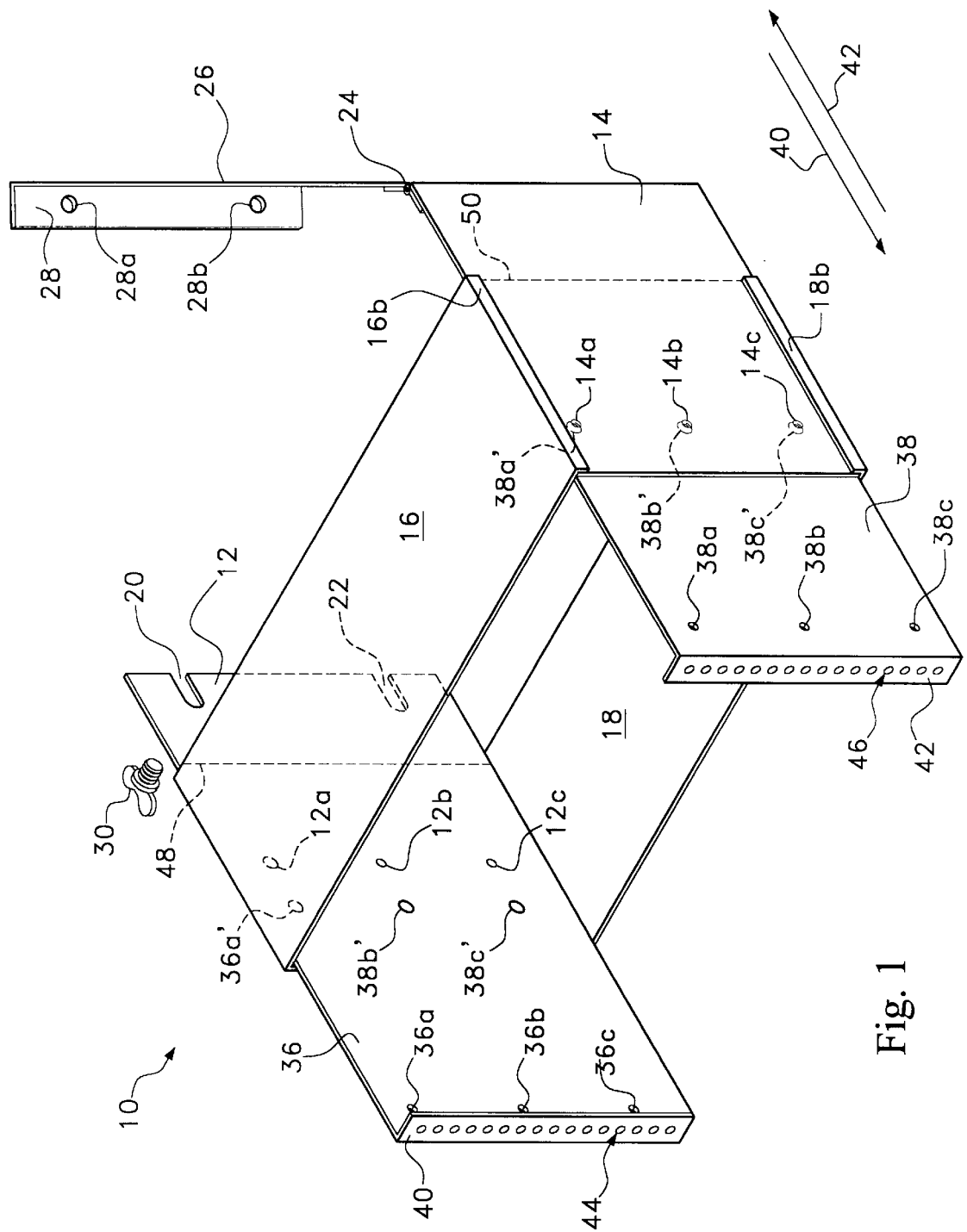
FIG. 1 is a front perspective view of an enclosure according to the present invention.

The enclosure apparatus according to the present invention is shown generally at 10 in the FIGS. 1–6 and is referred to herein as the enclosure.

Referring to FIGS. 1–6, the enclosure 12 includes opposed sidewalls 12,14, a top 16 and a bottom 18 connected to the sidewalls 12,14. The top 16 and bottom 18 are each at their respective opposed ends bent to provide flanges 16a, 16b for the top 16, and flanges 18a, 18b for the bottom 18. The corresponding pairs of flanges 16a, 16b and 18a, 18b are connected to the sidewalls 12,14 and provide the necessary rigidity for the enclosure 10.

While the disclosure refers to a particular top 16 and bottom 18 for the enclosure 10, this is by way of example only, and the aforementioned top 16 and bottom 18 assume the other's orientation when the enclosure 10 of the present invention is inverted for being selectively positioned for use.

Locking holes 12a–12c for sidewall 12, and locking holes 14a–14c for sidewall 14 are provided for a purpose to be described below.

The sidewall 12 includes a plurality of open ended slots 20,22.

A rearward end of the sidewall 14 is provided with a hinge 24 to which is pivotally connected a back wall 26 of the enclosure 10.

The back wall 26 is extended and bent to provide a flange 28 running a length of the back wall 26. Locking holes 28a–28b are formed in the flange 28. The arrangement of the locking holes 28a–28b in the flange 28 are in registration with the slots 20,22 of the sidewall 12, so that when the back wall 26 is hingedly pivoted into a closed position such as shown in FIG. 2, the holes 28a–28b are in registration with the slots 20,22 of the sidewall 12. A mechanical fastener 30 such as a wing nut, shown in FIG. 1, can be disposed in the corresponding slot 20 and through the hole 28a to secure the back wall 26 in position with the flange 28 nested against the sidewall 12. Another of the mechanical fastener type 30 is also disposed in the corresponding slot 22 and through the hole 28b to assist in securing the back wall 26 against the sidewall 12.

The back wall 26 is provided with a plurality of mounting holes 26a–c and 26d–f as shown in FIG. 2. The mounting holes 26a–26f are of the key-shaped type to receive a screw or bolt head in the larger portion of the mounting hole, after which the shank or stem of the bolt is slid along the smaller portion of the key shaped hole, wherein the head of the screw or the bolt is retained against the wall of the hole. The mounting holes 26a–26c are oriented in one direction with respect to the back wall 26 and a plane shown generally at the broken line P extending through a longitudinal axis of the enclosure 10, while the mounting holes 26d–26f are oriented in an opposite direction on the back wall 26 with respect to the mounting holes 26a–26c and the plane P. The reason for this construction is that the enclosure 10 of the present invention has, at least, similar construction at opposed sides of the plane P or preferably, is symmetrically shaped about the plane P so that it can be inverted, wherein what used to be the top 16 functions as the bottom, and what used to be the bottom 18 functions as the top. This symmetrical construction of the enclosure 10 and its function is shown with respect to the FIGS. 1–2 when compared to FIG. 6, wherein in FIG. 6, the enclosure 10 has been inverted and the hinge 24 is now at the opposite side of the enclosure 10 and the mounting holes 26a–c, and 26d–f have been inverted, but still provide the necessary mounting regions for the enclosure 10 to be mounted to another structure, such as a wall. Accordingly, when the enclosure 10 is inverted about the plane P and thereafter mounted, enclosure 10 can now be pivoted open in an opposite direction and still provide the functionality for which it is intended.

The back wall 26 is also provided with a relatively large port 32 through which wires and cables can be guided to the hub hardware mounted within the enclosure 10. The port is shown, by way of example, in a substantially rectangular shape in the drawing FIGS. 2–4, although other shapes may be used. When the enclosure 10 is mounted to the wall, or when stacked with other enclosures, the port provides an entry for the cables extending to the hardware within the enclosure 10 and between enclosures operatively associated therewith.

There is also provided a space 34 which extends between the top 16 and the back wall 26, and between the bottom 18 and the back wall 26. The space 34 provides for clearance should the apparatus 10 be arranged in a stack so that cables and wires associated with the enclosure 10 can be guided through the space 34 between the top 16 and bottom 18, and the back wall 26.

Referring again to FIG. 1, the enclosure 10 also includes slidably movable panels 36,38 which operate as deployable arms to adapt the enclosure apparatus to accommodate hardware of different dimensions. Movement of the panels 36,38 is indicated by the arrows 40,42.

The panel 36 is bent at a forward edge into a flange 40, while the panel 38 is bent at a forward edge to form a flange 42. The flanges 36,38 are bent inward to face each other. Arranged along a length of the flanges 36,38 are a plurality of mounting holes 44,46, respectively. The mounting holes 44,46 are arranged to be in registration with each other to support patch panels (not shown) and to which the patch panels are secured.

Figure 2:
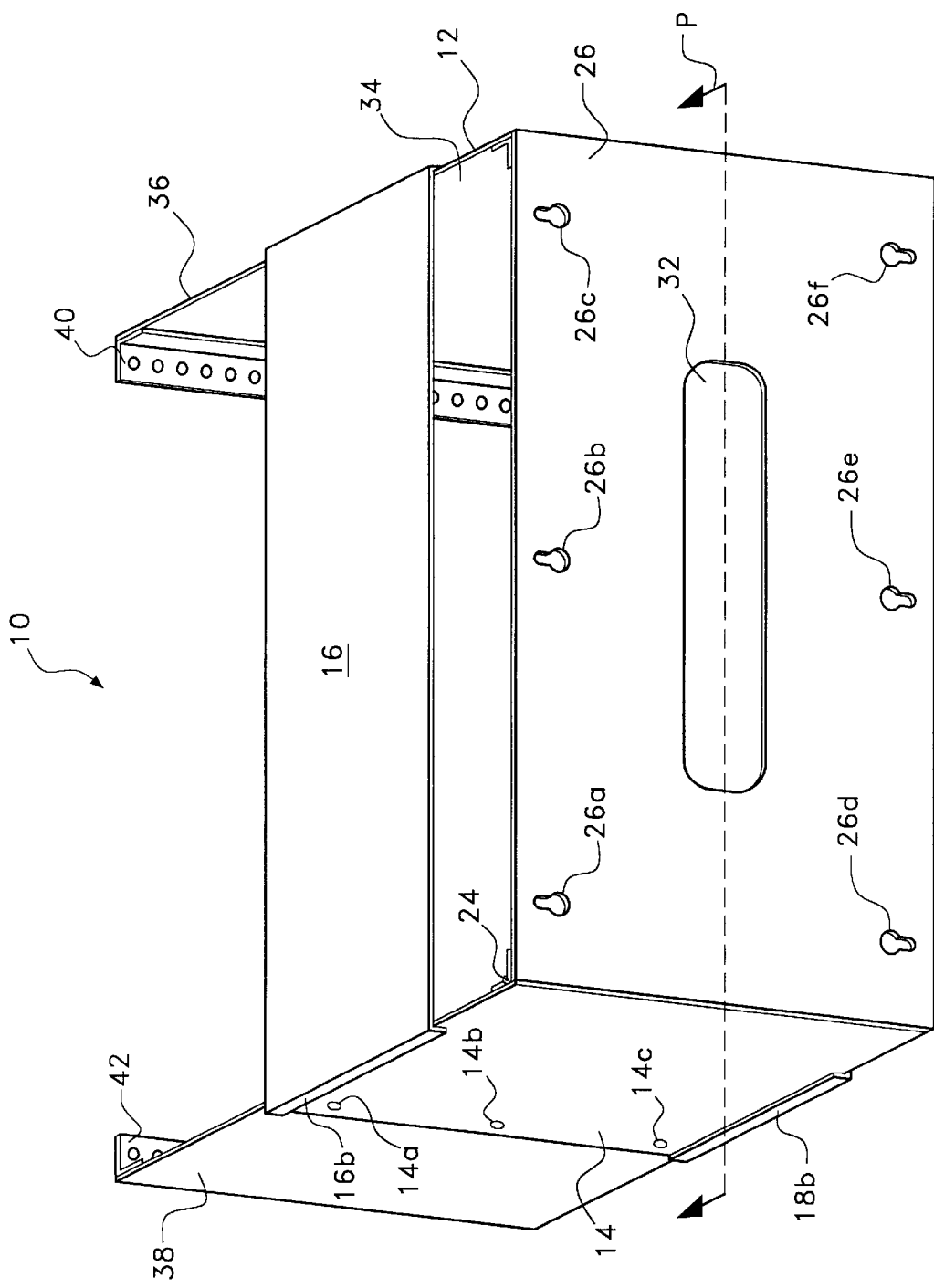
FIG. 2 is a rear perspective view of the enclosure in FIG. 1.
Figure 3:
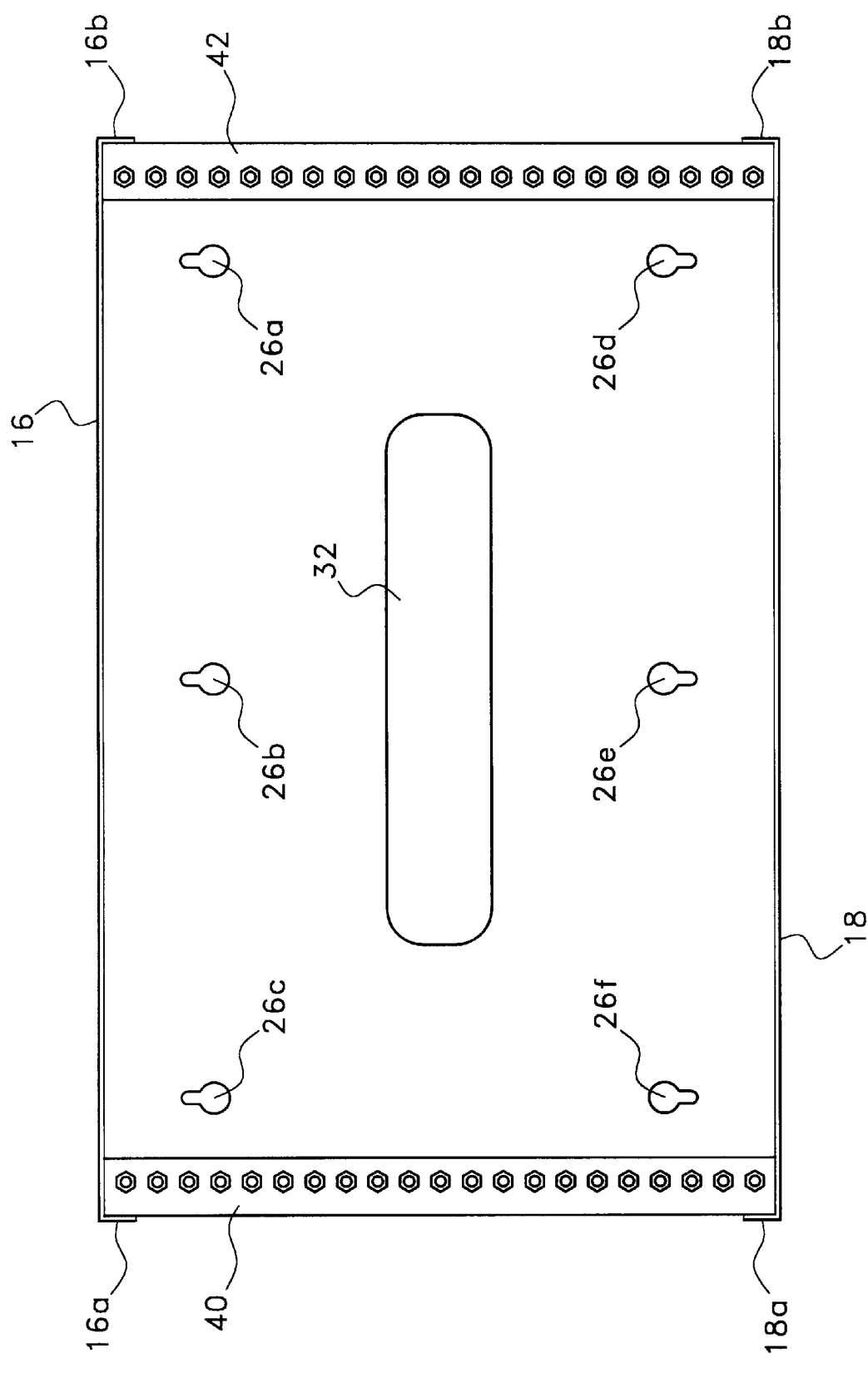
FIG. 3 is a front elevation view of the enclosure.
Figure 4:
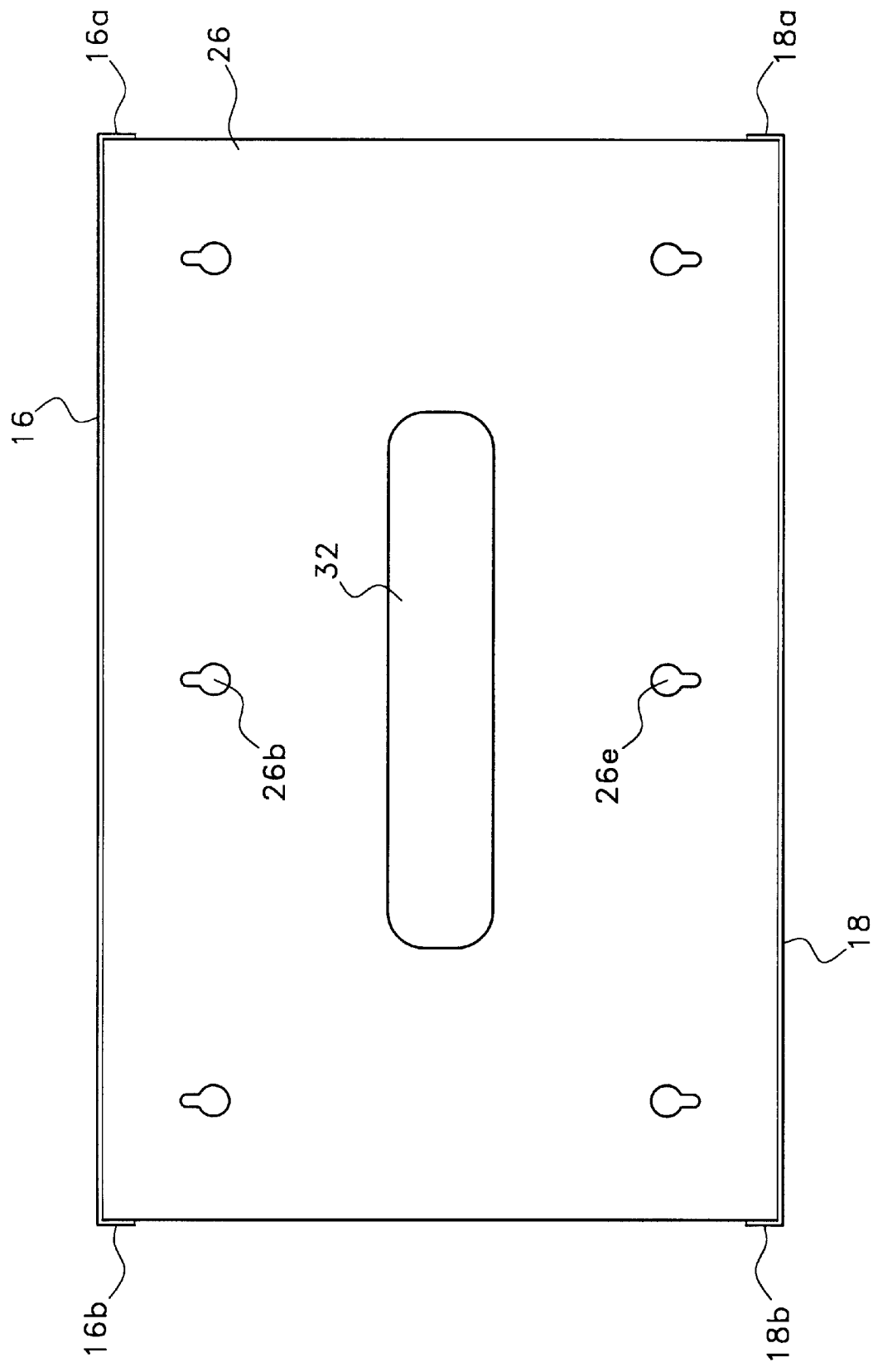
FIG. 4 is a rear elevation view of the enclosure.
Figure 5:
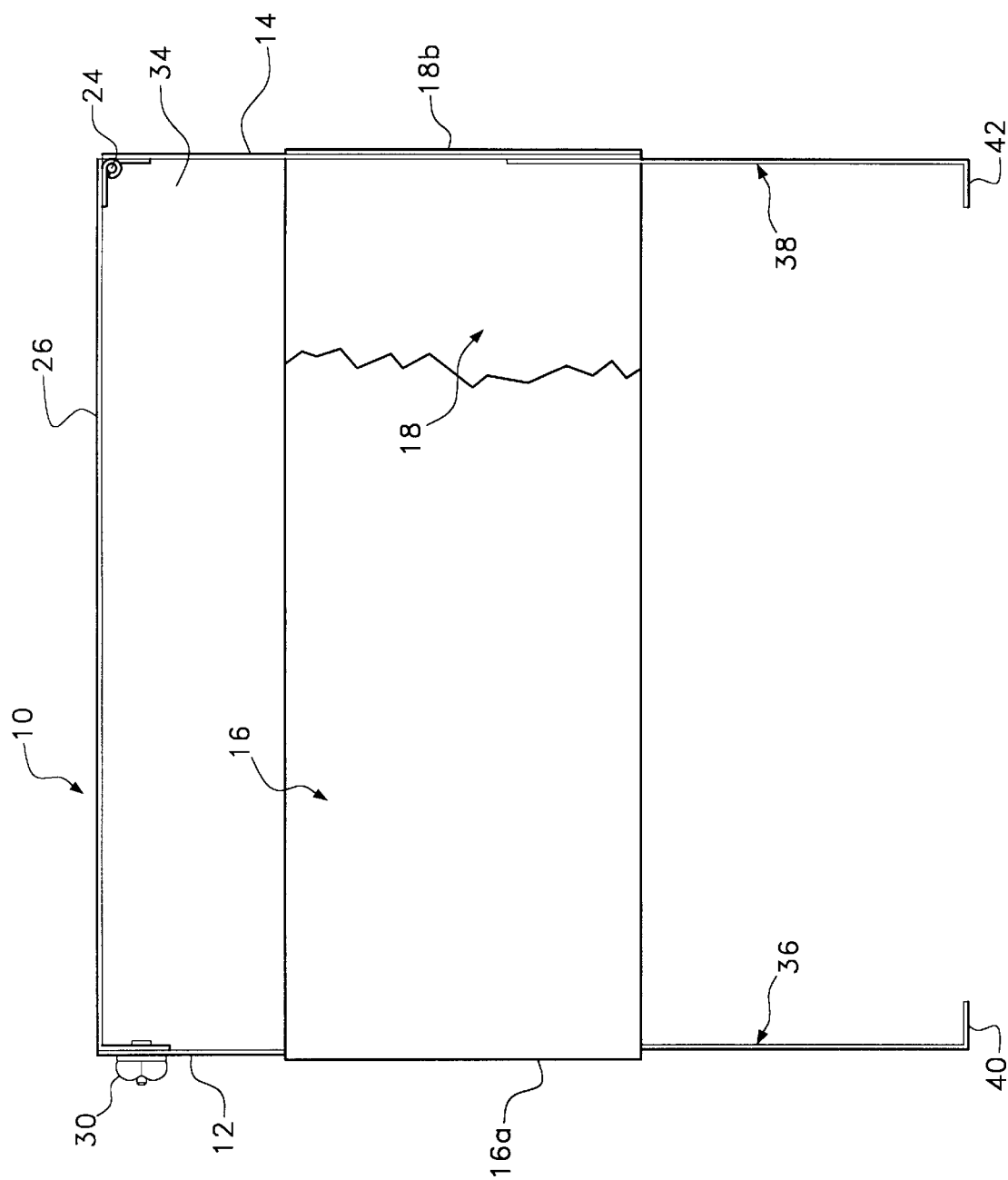
FIG. 5 is a plan view from above the enclosure in FIG. 1, an opposite plan view being a mirror image thereof.
Figure 6:
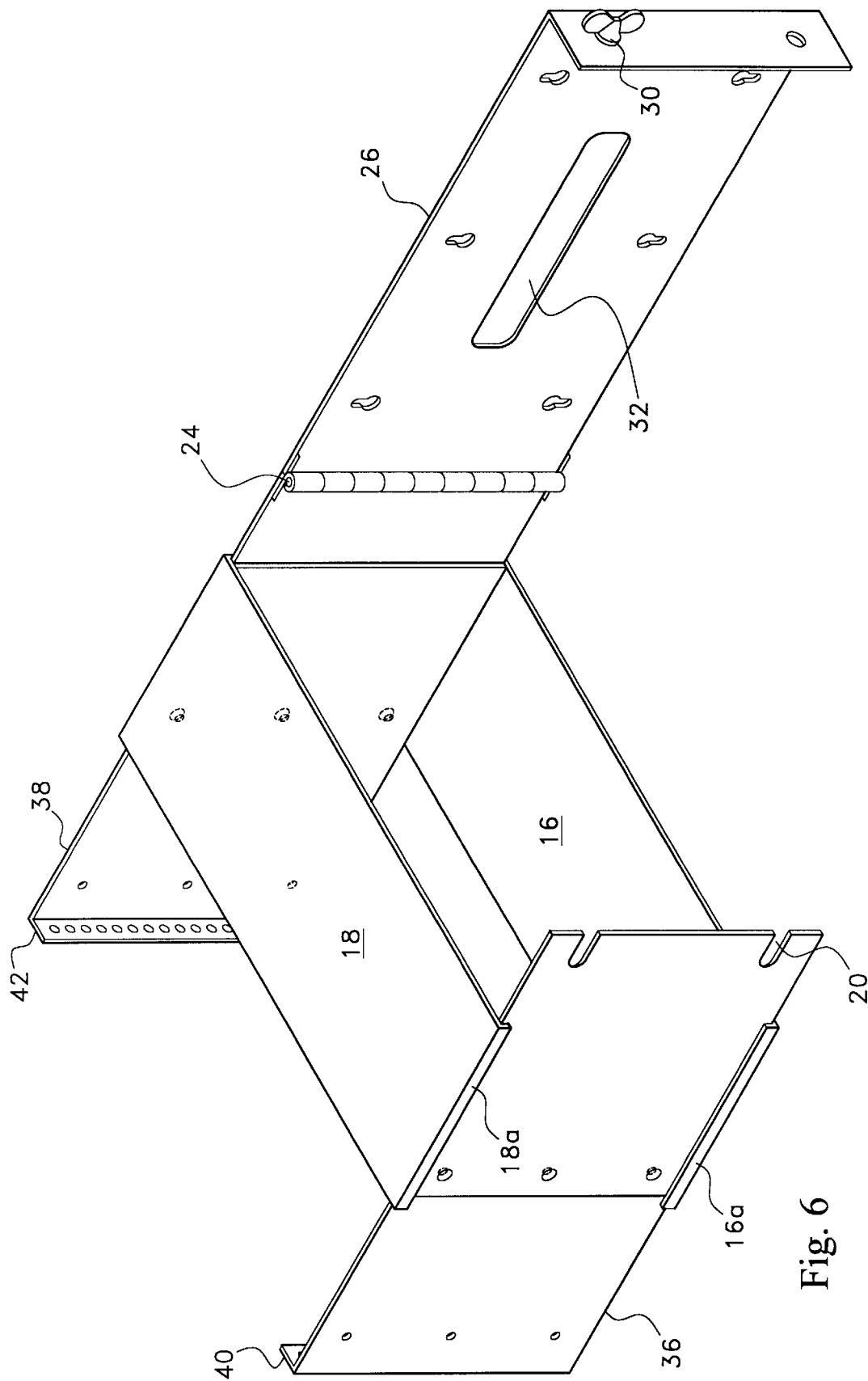
FIG. 6 is a rear perspective view of the enclosure in FIG. 1 having been inverted.

In FIG. 1, the panels 36,38, shown in a deployed position, are provided with mounting holes. For example, panel 36 is provided with a plurality of mounting holes 36a–36c, and 36a'–36c'. Panel 38 is provided with a corresponding number of mounting holes 38a–38c, and 38a'–38c'. The mounting holes 36a–36c and 36a'–36c' are arranged in the panel 36 for registration with locking holes 12a–c for securing the panel 36 in a plurality of positions. When the panel 36 is fully retracted into the housing 10, it will extend to the broken line 48. The mounting holes 38a–38c and 38a'–38c' are arranged in the panel 38 for registration with locking holes 14a–14c for securing the panel 38 in a plurality of positions. When the panel 38 is in the fully retracted position, it will extend to the broken line 50. Thereafter, a fastener such as the one shown at 30 is used to secure the panels 36,38 in their retracted or extended positions.

Alternatively, since the panels 36,38 move independently of each other, they can be moved into differing positions to accommodate hub structures or other computer equipment having irregular dimensions. Similarly, the size of the flanges 40,42 can be of different dimensions to receive patch panels constructed for a particular computer apparatus to be retained in the enclosure.

The sidewalls 12,14, top 16, bottom 18, back wall 26 and deployable panels 36,38 are preferably formed from an alloy. All these elements are preferably tack welded together to provide for increased rigidity of the enclosure 10 of the present invention.

Use of the enclosure 10 of the present invention as shown oriented in FIG. 1 permits the hub hardware (not shown) to be supported on the bottom 18 and the panels 36,38 slidably adjusted against the hub hardware to retain same. The patch panel (not shown) is mounted to the flanges 40,42 and the appearance from the front is that of a neat contained communication structure, the back of which is immediately accessible by release of the mechanical fasteners 30 and pivotally opening the enclosure 10 at the hinge 24. The back wall 26 remains mounted to the support or wall to which the enclosure 10 is mounted. If the location of the enclosure 10 is such that the hinged opening of the enclosure 10 is restricted in a particular direction, the enclosure 10 can be removed from the wall, inverted and thereafter remounted to hingedly open in an opposite direction permitting access to the cables and wiring at the rear of the hub hardware. The symmetrical arrangement of the two sets of mounting holes 26a–c and 26d–f permit immediate remounting to hardware already in the wall.

It will be understood that the embodiments described herein are merely exemplary and that a person skilled in the art may make variations and modifications without departing from the spirit and scope of the invention. All such modifications and variations are intended to be included within the scope of the invention as defined by the appended claims.

What is claimed is:

1. An enclosure for electronic equipment, comprising:
a first support panel having:
first support surface,
first opposed edges,
a first pair of flanges, each one of the first pair of flanges extending from a corresponding one of the first opposed edges;
a second support panel having:
second support surface,
second opposed edges,
a second pair of flanges, each one of the second pair of flanges extending from a corresponding one of the second opposed edges and facing a respective one of the first pair of flanges in registration therewith;
a first sidewall disposed between the first and second support panels at one of the first and second pair of flanges, the first sidewall including:
a plurality of first locking holes,
a plurality of guide slots;
a second sidewall disposed between the first and second support panels at the other of the first and second pair of flanges and spaced apart from the first sidewall for providing a space for the electronic equipment, the second sidewall including:
a plurality of second locking holes;
a third sidewall including:
a third flange extending along an edge of the third sidewall,
a plurality of third locking holes in the third flange corresponding in number to the plurality of guide slots in the first sidewall and arranged for registration with corresponding ones of the guide slots,
an access port through the third sidewall,
a plurality of mounting holes spaced apart about the access port for mounting the third sidewall to another object;
a hinge pivotally connecting the second sidewall to the third sidewall;
a first deployable panel disposed between the first and second pair of flanges for sliding movement with respect to the first and second support panels;
a second deployable panel disposed between the first and second pair of flanges for sliding movement with respect to the first and second support panels and spaced apart from the first deployable panel for independent movement;
wherein the size of the space between the support panels, the sidewalls and the deployable panels can be adjusted by movement of the first and second deployable panels and the enclosure can be inverted for mounting the third sidewall for the enclosure to be hingedly opened in an opposite direction.

2. An enclosure for electronic equipment, comprising:
a first support panel having:
  first support surface,
  first opposed edges,
  a first pair of flanges, each one of the first pair of flanges extending from a corresponding one of the first opposed edges;
a second support panel having:
  second support surface,
  second opposed edges,
  a second pair of flanges, each one of the second pair of flanges extending from a corresponding one of the second opposed edges and facing a respective one of the first pair of flanges in registration therewith;
a first sidewall disposed between the first and second support panels at one of the first and second pair of flanges, the first sidewall including:
  a plurality of first locking holes,
  a plurality of guide slots;
a second sidewall disposed between the first and second support panels at the other of the first and second pair of flanges and spaced apart from the first sidewall for providing a space for the electronic equipment, the second sidewall including:
  a plurality of second locking holes;
a third sidewall including:
  a third flange extending along an edge of the third sidewall,
  a plurality of third locking holes in the third flange corresponding in number to the plurality of guide slots in the first sidewall and arranged for registration with corresponding ones of the guide slots,
  an access port through the third sidewall,
  a plurality of mounting holes spaced apart about the access port for mounting the third sidewall to another object;
a hinge pivotally connecting the second sidewall to the third sidewall;
a first deployable panel disposed between the first and second pair of flanges for sliding movement with respect to the first and second support panels;
a second deployable panel disposed between the first and second pair of flanges for sliding movement with respect to the first and second support panels and spaced apart from the first deployable panel for independent movement;
wherein the size of the space between the support panels, the sidewalls and the deployable panels can be adjusted by movement of the first and second deployable panels.

3. An enclosure, comprising:
a housing having a support area therein and construction adapted for being mounted in a plurality of positions relative to a plane extending through a longitudinal axis of the housing;
mounting means operatively associated with the housing for selectively mounting the housing in a first one of the plurality of positions and a second one of the plurality of positions inverted from that of the first position about the plane; and
retaining means operatively associated with the housing, the retaining means comprising: a first member operatively associated with the housing, and a second member operatively associated with the housing, the first and second members independently movable with respect to each other and the housing to adjust the size of the support area in the housing when disposed in one of the first position and the second position.

4. An enclosure, comprising:
a housing having a support area provided in the housing at opposed sides of a plane extending through a longitudinal axis of the support area and the housing, the housing adapted to provide access to the support area when disposed in either one of a first position or a second position substantially inverted from that of the first position about the plane; and
retaining means operatively associated with the housing, the retaining means comprising: a first member movable with respect to the housing and a second member movable with respect to the housing independent of the first member to adjust the size of the support area in the housing.

5. The enclosure according to claim 4, further comprising:
mounting means operatively associated with the housing for selectively mounting the housing in either one of the first position or the second position.

6. The enclosure according to claim 4, further comprising support means extending from the retaining means for releasably receiving patch panels thereto.

7. The enclosure according to claim 4, wherein the first and second members of the retaining means comprise:
a first longitudinal member and a second longitudinal member, respectively.

8. The enclosure according to claim 4, wherein construction of the housing at the opposed sides of the plane is substantially similar.

9. The enclosure according to claim 4, wherein construction of the housing at opposed sides of the plane is substantially symmetrical.

10. The enclosure according to claim 4, wherein the retaining means further comprises:
locking means for locking the retaining means in a select position with respect to the housing.

11. The enclosure according to claim 10, wherein the locking means comprises:
apertures extending through the retaining means and through which mechanical fasteners can be inserted for coaction with the housing to lock the retaining means into a position with respect to the housing.

12. The enclosure according to claim 5, wherein the mounting means is pivotally connected to the housing.

13. The enclosure according to claim 5, further comprising:
a hinge interconnecting the mounting means with the housing for enabling the housing to pivot with respect to the mounting means.

14. The enclosure according to claim 5, wherein the mounting means further comprises:
an aperture through which wiring extends into the support area of the housing.

15. The enclosure according to claim 5, wherein the mounting means is spaced apart from the housing for access to the support area from above and below the support area.

16. The enclosure according to claim 5, wherein the mounting means comprises:
a longitudinal member.

17. The enclosure according to claim 16, wherein the longitudinal member further comprises:
a plurality of mounting holes separate and discrete from each other and adapted for releasably mounting the longitudinal member in either one of the first position or the second position substantially inverted from the first position.

18. A rack system for electronic equipment, comprising:

a plurality of enclosures stackable with respect to each other, each one of the plurality of enclosures, comprising:

a housing having a support area therein and substantially symmetrical construction at opposed sides of a plane extending through a longitudinal axis of the housing, the housing adapted to provide access to the support area when disposed in either one of a first position or a second position substantially inverted from that of the first position about the plane; and retaining means operatively associated with the housing, the retaining means comprising: a first member movable with respect to the housing and a second member movable with respect to the housing independent of the first member to adjust the size of the support area in the housing.

* * * * *